United States Patent
Hewson et al.

(10) Patent No.: US 9,606,152 B2
(45) Date of Patent: Mar. 28, 2017

(54) APPARATUS FOR CURRENT MEASUREMENT

(75) Inventors: Christopher R. Hewson, Beeston (GB); Joanne M. Aberdeen, Beeston (GB); William F. Ray, Attenborough (GB)

(73) Assignee: Power Electronic Measurements Ltd., Nottingham (GB)

( * ) Notice: Subject to any disclaimer, the term of this patent is extended or adjusted under 35 U.S.C. 154(b) by 530 days.

(21) Appl. No.: 14/006,931

(22) PCT Filed: Mar. 7, 2012

(86) PCT No.: PCT/EP2012/053893
§ 371 (c)(1),
(2), (4) Date: Nov. 6, 2013

(87) PCT Pub. No.: WO2012/130572
PCT Pub. Date: Oct. 4, 2012

(65) Prior Publication Data
US 2014/0306690 A1  Oct. 16, 2014

(30) Foreign Application Priority Data
Mar. 30, 2011 (GB) .................. 1105400.4

(51) Int. Cl.
*G01R 19/25* (2006.01)
*G01R 15/18* (2006.01)
(Continued)

(52) U.S. Cl.
CPC ........... *G01R 19/25* (2013.01); *G01R 15/181* (2013.01); *G01R 19/0084* (2013.01);
(Continued)

(58) Field of Classification Search
CPC  G01R 19/25; G01R 19/0084; G01R 19/0092; G01R 15/181; G01R 15/185;
(Continued)

(56) References Cited

U.S. PATENT DOCUMENTS 3,493,784 A    2/1970  Brolin
5,502,374 A *  3/1996  Cota ................... G01R 15/186
                                                        324/119

(Continued)

FOREIGN PATENT DOCUMENTS

DE    2333674    1/1975

OTHER PUBLICATIONS

An American National Standard, IEEE Standard Requirements for Instrument Transformers, 1987.*
(Continued)

*Primary Examiner* — Tung X Nguyen
*Assistant Examiner* — Lee Rodak
(74) *Attorney, Agent, or Firm* — Schwabe, Williamson & Wyatt, P.C.

(57) ABSTRACT

A voltage to current converter is provided for use with a current measuring device, said current measuring device being operable to provide an output voltage which is an analog of a current to be measured. The converter is arranged to provide an output current which is an analog of the current to be measured. The converter comprises an electronic controller, a switching amplifier and means for measuring the output current as an analog voltage and providing a measure of said analog voltage to the electronic controller.

19 Claims, 9 Drawing Sheets

(51) Int. Cl.
*G01R 19/00* (2006.01)
*H03F 3/217* (2006.01)
*H03F 3/45* (2006.01)
*G05F 1/56* (2006.01)

(52) U.S. Cl.
CPC ......... *G01R 19/0092* (2013.01); *G05F 1/561* (2013.01); *H03F 3/217* (2013.01); *H03F 3/2173* (2013.01); *H03F 3/45475* (2013.01); *H03F 2200/261* (2013.01); *H03F 2203/45512* (2013.01); *H03F 2203/45526* (2013.01); *H03F 2203/45528* (2013.01); *H03F 2203/45594* (2013.01); *Y10T 29/49117* (2015.01)

(58) Field of Classification Search
CPC ........ G01R 13/03; G01R 19/18; G01R 19/22; G05F 1/561; H03F 3/217; H03F 3/2173; H03F 3/45475; H03F 2200/261; H03F 2203/45512; H03F 2203/45526; H03F 2203/45528; H03F 2203/45594; Y10T 29/49117; H01L 41/044; H02M 2001/007
USPC ....... 324/120, 607, 713, 127, 546, 547, 726, 324/117 R, 117 H
See application file for complete search history.

(56) References Cited

U.S. PATENT DOCUMENTS

| | | | |
|---|---|---|---|
| 5,519,310 A | 5/1996 | Bartlett | |
| 2003/0090356 A1* | 5/2003 | Saito | G01R 15/181 336/213 |
| 2005/0162223 A1* | 7/2005 | Maejima | H03F 3/2171 330/10 |
| 2006/0279355 A1* | 12/2006 | Poulet | H03M 3/358 330/10 |
| 2007/0024269 A1* | 2/2007 | Tadatsu | G01R 21/06 324/127 |
| 2009/0176467 A1* | 7/2009 | Im | H03J 3/06 455/182.1 |
| 2010/0045247 A1* | 2/2010 | Blanken | H03F 3/211 323/273 |
| 2013/0082690 A1* | 4/2013 | Hakemeyer | G01R 1/22 324/127 |

OTHER PUBLICATIONS

Search Report, issued in GB Patent Application No. 1105400.4, mailed Jul. 12, 2011, 3 pages.

International Search Report & Written Opinion, issued in PCT Patent Application No. PCT/EP2012/053893, mailed Jul. 2, 2012, 12 pages.

Hewson, C. R. et al., "Verification of Rogowski Current Transducer's Ability to Measure Fast Switching Transients," 21st Annual IEEE Applied Power Electronics Conference and Exposition, Mar. 19, 2006, pp. 573-579.

Ray, W. F., "Rogowski Transducers for High Bandwidth High Current Measurement," IEE Colloquium on Low Frequency Power Measurement and Analysis, Nov. 2, 1994, pp. 10/1-10/6.

Patel, A. et al., "Advanced Current Sensing Techniques for Power Electronic Converters," Vehicle Power and Propulsion IEEE Conference, Sep. 9, 2007, pp. 524-530.

\* cited by examiner

APPARATUS FOR CURRENT MEASUREMENT

CROSS-REFERENCE TO RELATED APPLICATION

The present application is a national phase entry under 35 U.S.C. §371 of International Application No. PCT/EP2012/053893, filed Mar. 7, 2012, entitled "APPARATUS FOR CURRENT MEASUREMENT," which designated, among the various States, the United States of America, and claimed priority to Great Britain Application No. 1105400.4, filed Mar. 30, 2011. These applications are hereby incorporated by reference herein in their entireties.

TECHNICAL FIELD

The invention relates to current measurement systems and in particular to apparatus which can be used as a replacement for a conventional current transformer (CT).

BACKGROUND

CT's have been the principal apparatus for measuring ac currents of nominally 50 or 60 Hz in electrical power systems for many years and are well known. They generally have a torroidal iron core with a secondary winding wound on the core. The primary current to be measured is fed through the core central aperture and the secondary current in the coil, which is an instantaneous analogue of the primary current, is typically supplied to a resistor or other type of electrical load such as a relay coil to give a corresponding analogue voltage for metering, control or protection purposes. The turns ratio of the CT is generally arranged to give a secondary current of either 1 A rms or 5 A rms for the rated primary current. The CT load is generally known as the burden and will be referred to as such herein.

CT's essentially provide a current output which is an analogue of the current to be measured. They are generally not clip-around devices and to replace a CT necessitates disconnection of the conductor to which it is attached. They are also relatively heavy and bulky due to the iron core and copper winding, particularly for large current ratings, and they have the disadvantage that, in the event of the secondary winding being accidentally open circuited whilst primary current flows, an excessive and potentially lethal voltage will be produced across the secondary winding.

Alternative known methods of measuring electric currents are Hall-effect transducers, which also require an iron core, and Rogowski transducers which do not. In contrast to CT's, Rogowski transducers provide a voltage output which is an analogue of the current to be measured (such output also being appropriate for metering, control or protection purposes) and also, in contrast to CT's, these devices are available in a clip-around form.

Rogowski transducers comprise a Rogowski coil and an electronic integrator. They have the advantages of relatively small size and weight, high bandwidth, ability to withstand over-currents without damage, no high voltages following open circuiting the coil or integrator, and no injected impedance into the primary circuit. They are therefore becoming increasingly popular for measuring ac currents in electrical power systems. However conventional Rogowski transducers cannot be retro-fitted to existing current measurement systems in order to directly replace a CT therein unless the existing current monitoring or protection circuitry which the CT supplied is also replaced. This is because, unlike CT's, conventional Rogowski transducers do not provide an analogue current output. Replacing the current monitoring or protection circuitry is, however, costly, inconvenient and time-consuming for the end user.

There is no known means for measuring current which produces an analogue current output and which is also relatively lightweight, safe and straightforward to use.

An invention is set out in the claims.

According to an aspect a voltage to current converter is provided for use with a current measuring device, said current measuring device being operable to provide an output voltage ($V_I$) which is an analogue of a current ($I_1$) to be measured. The converter is arranged to provide an output current (I) which is an analogue of said current ($I_1$) to be measured. Said converter comprises an electronic controller, a switching amplifier, and means for measuring the output current (I) as an analogue voltage ($V_F$) and providing a measure of said analogue voltage ($V_F$) to said electronic controller. It may also comprise a filter connected to the switching amplifier.

According to an aspect a voltage to current converter is provided for use with a current measuring device, said current measuring device being operable to provide an output voltage ($V_I$) which is an analogue of a current ($I_1$) to be measured. The converter is arranged to provide an output current (I) which is an analogue of said current ($I_1$) to be measured. Said converter comprises an electronic controller, a switching amplifier, and a filter connected to the switching amplifier. The filter may be connectable between first and second capacitance values. The capacitance of the filter may be substantially zero. The filter may be comprised as part of a load connected to the converter.

According to an aspect a voltage to current converter is provided for use with a current measuring device, said current measuring device being operable to provide an output voltage ($V_I$) which is an analogue of a current ($I_1$) to be measured. The converter is arranged to provide an output current (I) which is an analogue of said current ($I_1$) to be measured. Said converter comprises the following components: an electronic controller, a switching amplifier, a resistor for measuring the output current (I) as an analogue voltage ($V_F$) and a filter connected to the switching amplifier. Any of the components may be selected for inclusion in the converter based on one or more of its operational characteristics, or based on an operational characteristic of another of the components, so that the converter can operate within specified limits. For example, the components may be selected so that the value of the output current (I) provided by the converter—which is an analogue of said current ($I_1$) to be measured—is accurate to within a predetermined limit under a range of operating conditions.

According to an aspect a current measurement system is provided including a current measuring device operable to provide an output voltage ($V_I$) which is an analogue of a current ($I_1$) to be measured and a voltage to current (V to I) converter, said converter being arranged to provide an output current (I) which is an analogue of said current ($I_1$) to be measured.

According to an aspect a method is provided of manufacturing a voltage to current (V to I) converter and/or a current measurement system substantially as described herein.

According to an aspect a method is provided of designing a voltage to current (V to I) converter and/or a current measurement system substantially as described herein.

FIGURES

Embodiments and examples will now be described with reference to the appended Figures, of which.

OVERVIEW

In overview, an apparatus is provided which converts the analogue voltage output of a conventional Rogowski transducer to an analogue current. The apparatus is referred to hereafter as a V to I converter. A CT replacement system including a current measuring device such as a Rogowski transducer and a V to I converter is also provided.

Providing a V to I converter for use with a Rogowski transducer might be regarded as being of no merit on the face of it since the resulting system performs a double conversion from a primary current being measured to a voltage output by the Rogowski transducer and then back to a current. Such double conversion adds to the cost of the measurement system. This would render the system disadvantageous in most real-world applications and therefore current measurement suppliers have not previously provided such a system. However, it has been recognised herein that, in the special case of a CT replacement, the overall advantage and convenience of using a Rogowski coil for current measurement without having to replace or modify the existing current monitoring or protection circuitry outweighs any disadvantage associated with the double conversion.

The CT replacement system described herein comprises a current measuring device (such as a Rogowski transducer) with means for providing an analogue voltage of the current to be measured together with a voltage to current (V to I) converter to provide an analogue current from said analogue voltage.

The voltage to current converter of said system preferably includes a switching amplifier, means for measuring the output current as an analogue voltage and an electronic controller which ensures such analogue voltage is substantially proportional to the analogue voltage from the Rogowski transducer at all instants of time.

In applications where the burden is of relatively low inductance, the voltage to current converter of said system also preferably includes a filter to substantially remove the high frequency current component of the switching amplifier.

The switching amplifier is preferably a class D amplifier.

The means for measuring the output current as an analogue voltage is preferably a resistor.

The electronic controller is preferably a P+I controller.

The filter preferably includes a first inductor in series with the output of the switching amplifier and a capacitor across the output of the switching amplifier and first inductor.

The filter may also include a second inductor connected between the capacitor and the output of the system.

DETAILED DESCRIPTION

Figure 1:
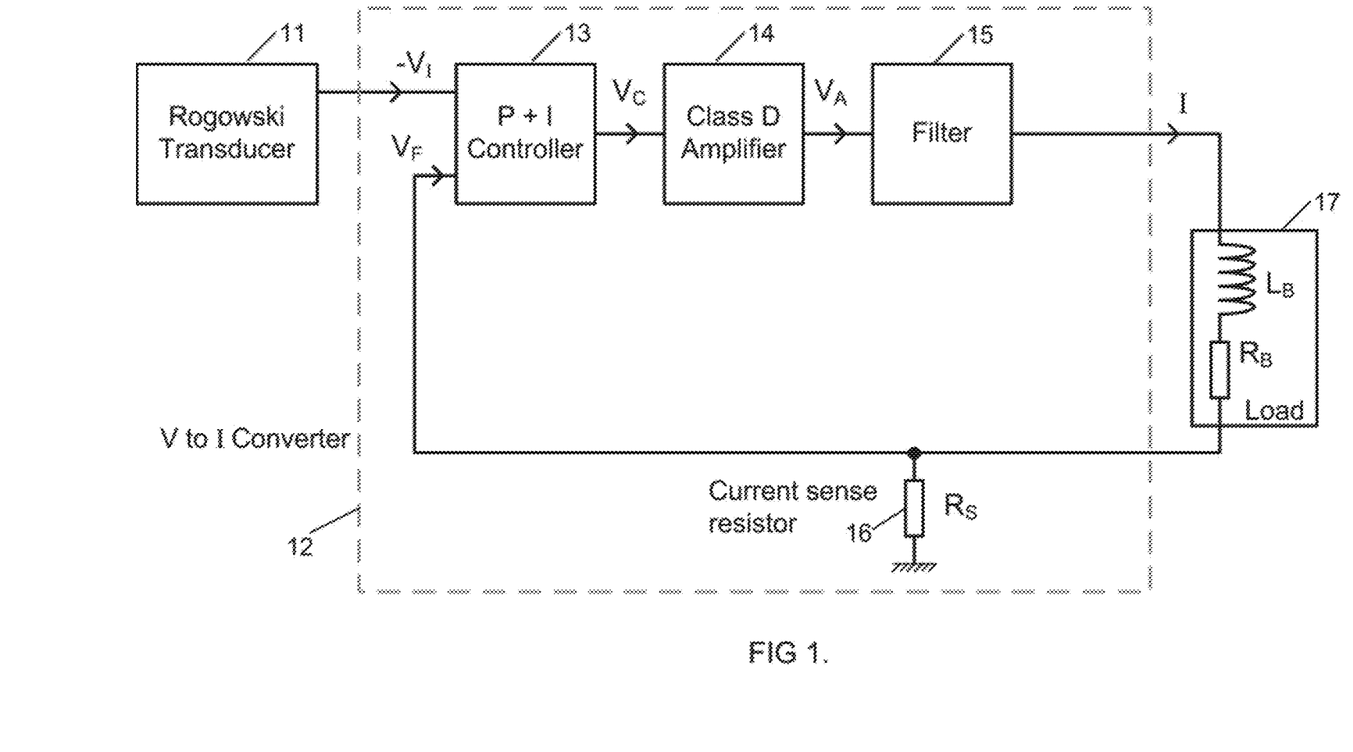
FIG. 1 is a schematic diagram illustrating the principal parts of a current measurement system, in particular the feedback loop for a V to I converter which maintains the output current as an instantaneous analogue of the current to be measured.

FIG. 1 shows a schematic of a current measurement system according to an embodiment, comprising both a Rogowski transducer and a V to I convertor connected to a load.

Rogowski Transducers

Figure 2:
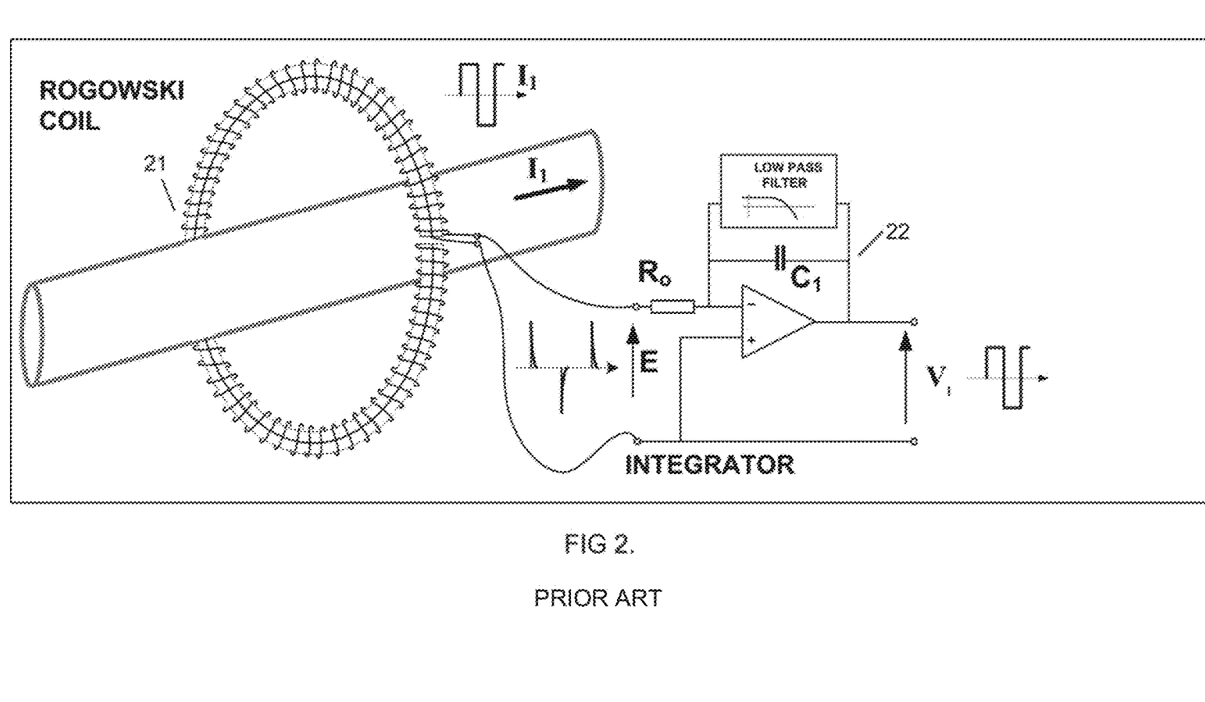
FIG. 2 shows the basic elements and behaviour of a typical Rogowski transducer.

A conventional Rogowski transducer can be used in the current measurement systems described herein. FIG. 2 shows schematically a typical Rogowski transducer 11 which comprises a Rogowski coil 21 connected to an electronic integrator 22. The Rogowski transducer 11 operates in a conventional manner in the systems described herein and has no special features which are not already known. Hence no detailed description of Rogowski transducers is provided herein. Details of the design and operation of Rogowski transducers can be found for example in "*Wide bandwidth Rogowski current transducers: Part 1—The Rogowski coil*", EPE Journal, Vol 3, No 1, pp 51-59, March 1993, by Ray W F and Davis R M and in: "*Wide bandwidth Rogowski current transducers: Part 2—The Integrator*", EPE Journal, Vol 3, No 2, pp 116-122, June 1993, by Ray W F.

The Rogowski transducer can take forms other than as shown in FIG. 2. For example the coil may contain an electronic screen to minimise interference from external voltages and currents, as described in "*The effect of electrostatic screening of Rogowski coils designed for wide-bandwidth current measurement in power electronic applications*", IEEE PESC Conference Proc., Aachen, September 2004 by Ray W F and Hewson C R. Additionally or alternatively the integrator may be non-inverting as described for example in "*High frequency improvements in wide bandwidth Rogowski transducers*", EPE 99 Conference Proc., Lauzanne. September 1999, by Ray W F and Davis R M. The particular form of the Rogowski transducer is not of relevance provided it gives an output voltage that is instantaneously proportional to current.

As an alternative, the Rogowski transducer could be replaced by a similar transducer giving an output voltage instantaneously proportional to current such as a Hall-effect transducer.

In operation for current measurement as described herein, the coil 21 of the Rogowski transducer is placed in a closed loop around the conductor carrying the current to be measured $I_1$ and it provides an output voltage E which is instantaneously proportional to the rate of change of that current ($dI_1/dt$). The coil voltage E is connected to the integrator 22 which gives an output $V_I$ which is instantaneously proportional to $\int E \cdot dt$. Hence $V_I$ is instantaneously proportional to the current being measured $I_1$.

The current waveform $I_I$ shown in FIG. 2 is of square shape to illustrate the operation of the Rogowski transducer therein. In the current measurement systems described herein the current wave-shape for typical 50 Hz currents is sinusoidal, as will be the coil voltage E and the output voltage $V_I$.

CT Replacement System

The current measurement system shown schematically in FIG. 1 can be implemented to replace a Current Transformer (CT) in a circuit. The system includes a V to I converter 12 connected to a Rogowski transducer 11. The converter 12 comprises a switching amplifier, an electronic controller and means to measure the current output by the converter as an analogue voltage. Preferably, it also comprises a filter. The particular embodiment shown in FIG. 1 comprises a P+I controller 13, an amplifier 14, a filter 15 and a current sense resistor $R_S$ 16, as described in more detail below.

As will be understood further from the description below, using the system disclosed herein to replace a CT has several associated advantages. The Rogowski transducer can be provided in a compact form, such as a thin, flexible clip-around form. It is therefore useful for retro-fit, to replace an existing CT. The length of the Rogowski coil can be chosen to suit the intended use and is not dependent on the magnitude of the primary current being measured. The Rogowski transducer is intrinsically safe and provides galvanically isolated measurement. It is not damaged by over current.

The current measurement system disclosed herein gives low phase error and provides linearity with the primary current being measured. Its accuracy varies little upon variation of conductor position in the Rogowski coil. And the system can perform wide-band operation.

When the system of FIG. 1 is in operation; the Rogowski transducer 11 provides an output voltage $-V_I$ which is an analogue of the ac current to be measured, typically with an instantaneous peak output of 6V. The output voltage $-V_I$ is fed into the V to I converter 12 in order to provide an output current I. This output current I can be fed into conventional metering equipment or other circuitry represented by a load or burden impedance 17 of resistance $R_B$ and inductance $L_B$ and circulates back through the current sense resistor $R_S$ 16. $R_B$ $L_B$ are taken to include the resistance and inductance of a cable or connector connecting the load to the V to I converter 12 in FIG. 1.

In operation; the current sense resistor $R_S$ 16 within the converter 12 produces a feedback voltage $V_F$ which is fed to the P+I controller 13 and is compared with $-V_I$ by means of the P+I controller 13. The output voltage $V_C$ from the P+I controller 13 is amplified by the amplifier, which is preferably a class D amplifier 14, and filtered by the filter 15 to provide the converter output current I. Thus, the output current I is adjusted using the well known principle of error actuation to make I instantaneously proportional to $V_I$ and hence instantaneously proportional to the current being measured. The complete system as shown in FIG. 1 therefore can be used to replace a conventional CT.

Figure 3:
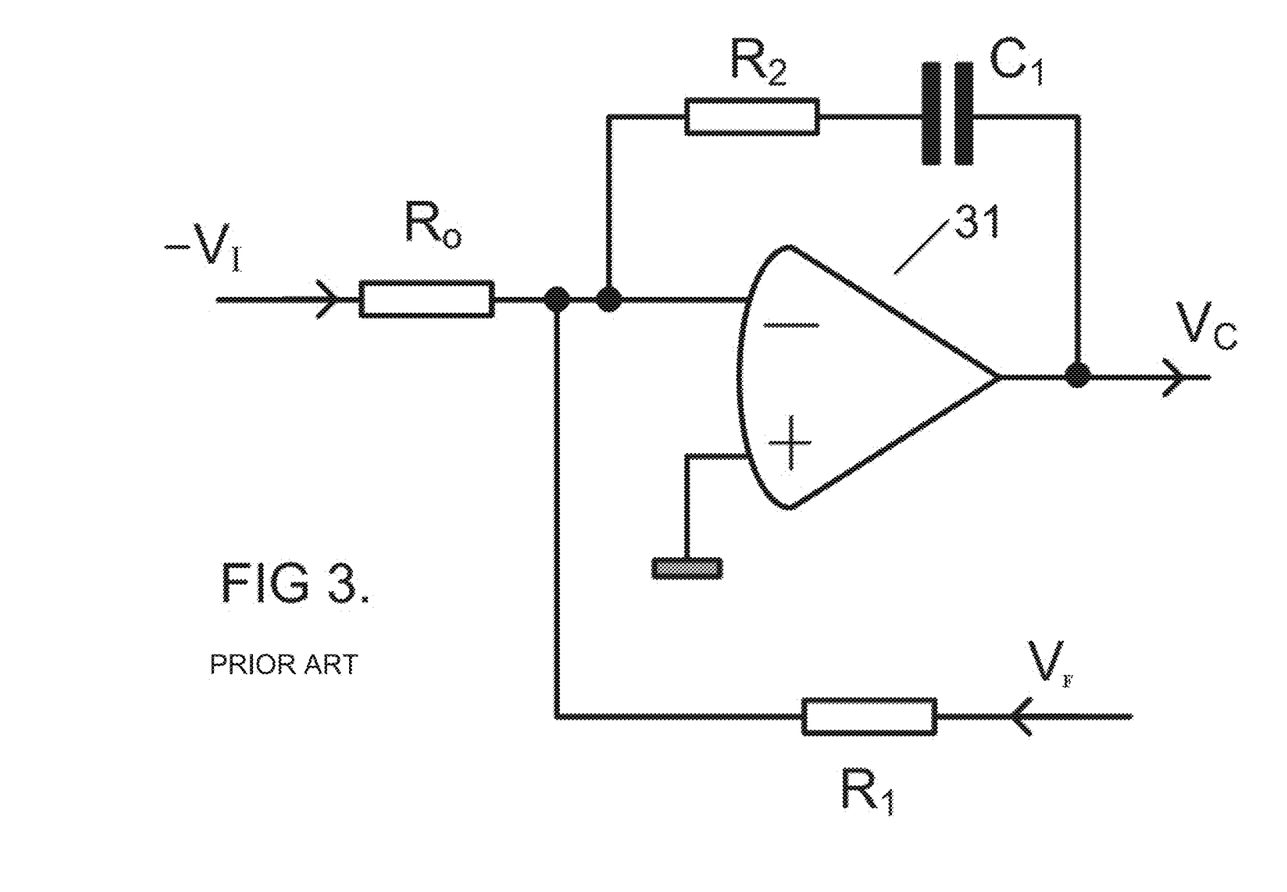
FIG. 3 shows a typical circuit for a proportional-integral (P+I) controller.

FIG. 3 shows an electronic circuit for a typical P+I controller 13 that can be used in a current measurement system as shown in FIG. 1. The output voltage $-V_I$ from the Rogowski transducer 11 is fed into the P+I controller, as shown in FIG. 1.

The basic arrangement of the components in the P+I controller circuit shown in FIG. 3 is conventional. The P+I controller 13 comprises an operational amplifier 31 and passive components $R_0$, $R_1$, $R_2$ and $C_1$. Its output voltage $V_C$ is given by the Laplacian transfer function $$V_C = \frac{K_C(s + A_C)}{s}\{V_I - \beta \cdot V_F\} \quad \text{Eqn 1}$$

where $K_C = \frac{R_2}{R_0}$, $\beta = \frac{R_0}{R_1}$ and $A_C = \frac{1}{C_1 R_2}$ The three constants which define the behaviour of this controller—$K_C$, $A_C$ and $\beta$—have been arbitrarily given these symbols. Any other symbols could be used to define the ratios shown. However it has been recognised herein that the values of the ratios defined by these constants can be chosen in order to optimise operation of the P+I controller 13 for the purpose of the V to I converter disclosed herein.

Looking at the constants in more details, $\beta$ defines a ratio between two of the passive components ($R_0$ and $R_1$) in the P+I controller 13. It is a scaling constant to match the converter reference voltage $V_I$ to the feedback voltage from the current sense resistor $V_F$. $K_C$ also defines the ratio between two of the passive components ($R_2$ and $R_0$) in the P+I controller 13 and represents the proportional gain of the P+I controller. $A_C$ defines the inverse of the product of another two of the passive components ($R_2$ and $C_1$) in the P+I controller 13. The product $K_C A_C$ represents the integral gain of the P+I controller. $K_C$ and $A_C$ are control constants that set the dynamic performance of the V to I converter.

It has been recognised herein that the values of $K_C$ and $A_C$ can be chosen to give reliable performance over the required range of burden impedances for any given system, as will be understood further from the particular examples discussed below.

This reliability of the P+I controller over a range of burden impedances facilitates the usefulness of the V to I converter in practical applications.

By way of example, for a rated output current of 1 A rms it is convenient to arrange for the Rogowski transducer output $V_I$ to be 3V rms. Choosing the current sense resistor $R_S = 0.25\Omega$ requires a value $\beta = 12$ or $R_0 = 12 \cdot R_1$. The ratio values for $K_C$ and $A_C$ can be chosen with this $\beta$ ratio in mind to give satisfactory closed loop stability and bandwidth. If these ratio values are chosen correctly, such that the closed loop bandwidth is sufficiently high, and due to the integral behaviour of the controller 13, the relationship $I = V_I/3$ will be accurately followed at power frequencies.

The general purpose and behaviour of P+I controllers is known and hence will not be described further herein. Any composition of P+I controller can be used in the system of FIG. 1 provided it gives an output voltage as defined by equation 1. Therefore other forms of P+I controller, or any other suitable control technique, which differ from the example shown in FIG. 3, could be used.

The output voltage $V_C$ from the controller 13 is fed into an amplifier, as shown in FIG. 1. Preferably, a class D amplifier is used because of its efficiency. However, other types of amplifier can be used of the analogue or digital form.

Figure 4:
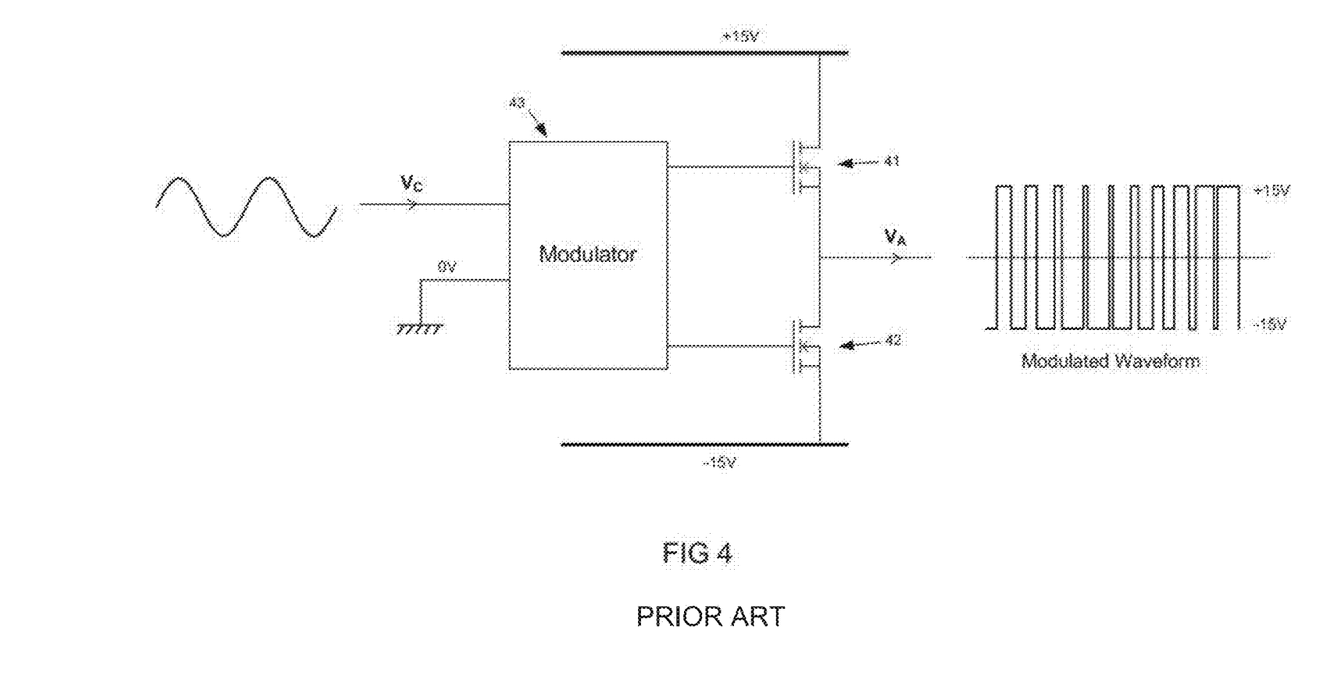
FIG. 4 shows the basic elements and behaviour of a class D amplifier.

FIG. 4 shows schematically a form of class D amplifier 14. It includes a modulator 43 and first 41 and second 42 switches. In operation, the modulator 43 can connect to a positive or negative voltage dependent on which switch is on at any given time. Furthermore, the modulator 13 can control switching times for the mean voltage $V_{A\ mean}$ across the amplifier in order to match the voltage $V_C$ which feeds into the amplifier 14 from the P+I controller 13

The particular amplifier 14 shown by way of example in FIG. 4 comprises a ±15V power supply, two electronic switches such as FETs 41 and 42 and a modulator 43.

The switches 41 and 42 are turned on and off respectively to connect the amplifier output to +15V for a time of duration $T_P$ and are then turned off and on respectively to connect the output to −15V for a time of duration $T_N$ where $T_P+T_N=T_C$=constant. By way of example, $T_C$ can be chosen to be 3.33 μs giving a switching frequency of 300 kHz.

For convenience in this description a gain of 1 is taken for the amplifier 14 relating the mean amplifier output voltage $V_A$ to the input voltage $V_C$. However in practice the gain may take on other values.

With the input voltage $V_C$=0 the modulator 43 within the class D amplifier 14 sets $T_P=T_N$ such that the mean output voltage from the amplifier 14 $V_A$=0. The rms value for $V_A$ under this condition is 15V rms.

For a sinusoidal current waveform, the input voltage $V_C$ to the amplifier 14 can be defined as: $V_C=1\cdot\sin(2\pi f\cdot t)$ where f=50 Hz. In such an example, the modulator is set to periodically vary $T_P$ and $T_N$ such that the mean output voltage $V_{A\ mean}=1\cdot\sin(2\pi f\cdot t)$. The output voltage $V_A$ therefore comprises a signal component at the same frequency as $V_C$ superimposed on a carrier component of frequency 300 kHz. This type of pulse width modulation is often referred to as class D modulation and is very well known. Integrated circuits are readily available for implementing the modulator 43 and providing this type of modulation.

Using a class D amplifier in the current measurement system has the advantage of very high efficiency since the switches are either fully on or fully off, as compared with alternate forms of amplifier such as class B. However alternative forms of modulation may be used in the V to I converter 12 provided the efficiency is sufficiently high. For example, sigma-delta modulation may be used to vary the carrier frequency and provide frequency modulation. Alternatively a technique such as lowest total harmonic distortion, optimised for a particular frequency band, may be used. The amplifier should provide switched mode amplification, not linear amplification.

The class D amplifier will typically output a pulse width modulated (PWM) signal of the order of 300 kHz. Therefore it is preferable for that output signal to be filtered rather than being fed directly to the load. As shown in FIG. 1, the V to I converter therefore preferably includes a filter 15. The filter connects to the load.

Figure 5A:
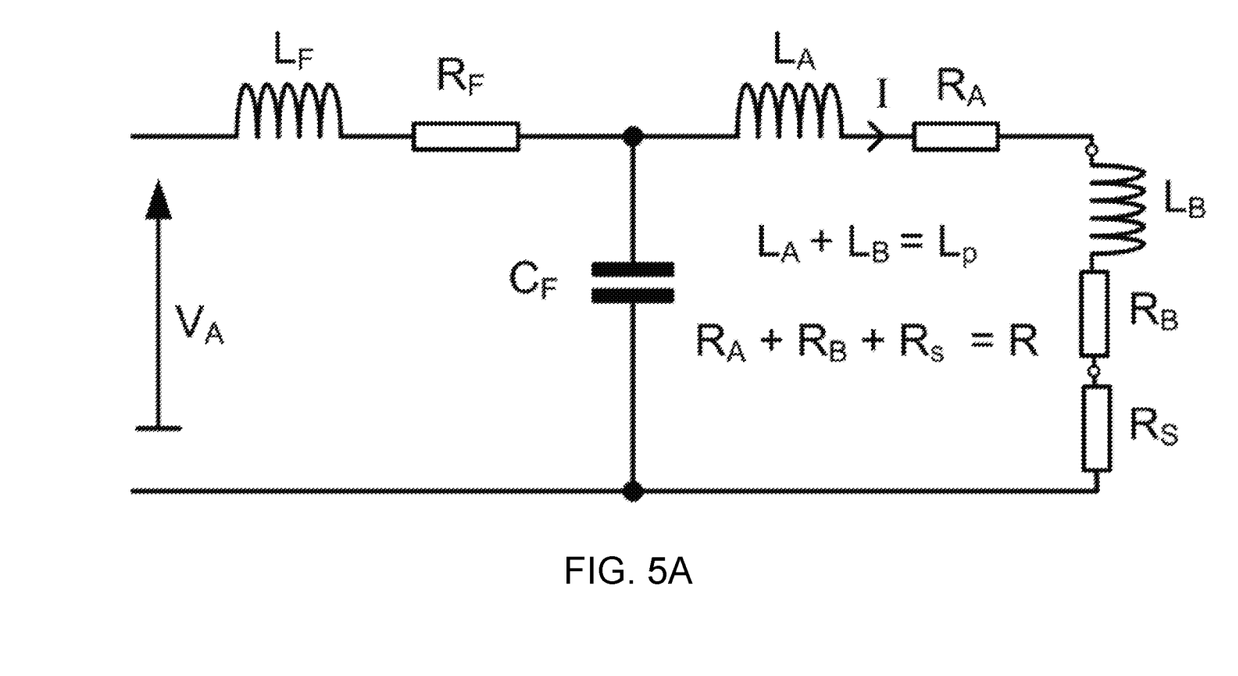
FIG. 5A shows a circuit for a 3rd order filter including a load impedance which can largely dictate the behaviour of the V to I converter of FIG. 1.

The relationship between input voltage $V_A$ and current in the filter 15 of FIG. 5A is highly oscillatory. The filter 15 must be able to cope with this oscillation, and with the variation of load that the current measurement system is required in practice to be able to work in conjunction with, and still be able to provide a stable and accurate current output. The filter 15 should therefore preferably include one or more inductors and one or more capacitors, but no resistors, such that little or no damping is provided.

FIG. 5A shows an example of the circuit for a filter 15 that can be used in a current measurement system as shown in FIG. 1. The filter 15 of FIG. 5A conventionally includes one or more inductors and one or more capacitors depending on the desired order of the filter. To minimise the power loss in the convertor and to achieve good efficiency, the resistance of the filter components should be minimal. As a result the damping in the filter is minimal and the relationship between the input voltage VA and the current I in the filter is highly oscillatory.

If the load inductance $L_B$ is sufficiently large it is possible to omit the filter components and instead rely on the load impedance to attenuate the high frequency ripple current.

The sense resistor $R_S$ is used to measure the current I which flows out of the V to I converter 12, through the load, as an analogue voltage. It feeds back to the electronic controller, as described above.

CT Classification

As will be known to the skilled reader, conventional CT's are classified according to their accuracy and Volt-Amp (VA) rating. Class 1 specifies an accuracy of 1% or better with a burden variation of 25% to 100% rated burden impedance and a phase error not greater than 1 degree.

The components of the current measurement system disclosed herein can be selected and/or tuned to meet the requirements of class 1 CT's for different types of burden and load. For example, the system can be implemented to provide a CT replacement with a class 1 specification or better for metering applications for which the burden on the CT is highly resistive and for which the burden inductance is insignificant. This is a major field of application for which accuracy and low phase error are important.

The current measurement system disclosed herein can also be used to minimise the phase error or at least provide a predictable value of phase error for the current measurement provided. The phase error of a Rogowski transducer at 50 Hz is a predictable phase lead. This predictability can be utilised to largely cancel the phase lag of the V to I converter 12 as described in more detail below. As a result, any measurement equipment used in conjunction with the system disclosed herein does not need to compensate for phase lag. This provides a significant advantage over conventional arrangements which use CT's for current measurement, which do have a significant and variable phase lag.

The operation of the V to I converter 12 and current measurement system, including its adaptability for different types of burden and ability to account for phase error, can be further understood with respect to the particular examples described below.

First Example

According to a first example, the burden on the class D amplifier 14 and filter 15 in a V to I converter 12 of the type shown in FIG. 1 is taken to be predominantly resistive at power frequencies. This is normally the case for current metering applications. In such an example, the filter 15 must be able to reduce the magnitude of the current I received from the amplifier 14 at high frequency without affecting the value of the current that is being measured.

In this first example it is assumed that $L_B$ is negligible (i.e. small compared with $L_A$) and any connection between the CT replacement system and the burden impedance is relatively short, such that the connection impedance does not significantly affect the behaviour of the system. This example also covers the case of very low filter resistance which minimises power loss and hence the size and cost of the controller components. However, since $R_F$ is Very low, the behaviour of the $L_F$ $C_F$ filter 15 is significantly oscillatory which imposes difficulty in designing a stable feedback control loop for the V to I converter.

For a 5 VA 1 A rms rating, the corresponding burden resistance $R_B$ is 5Ω (5 ohms). With a capability of a 120% over-current, this represents a maximum power output of 7.2 Watts. The input power requirements will be significantly greater than this due to losses within the V to I converter. Since the cost of the converter 12 will largely depend on the power ratings of its components, it is highly desirable to minimise the power loss by utilising a class D amplifier (or similar type of switching amplifier) and by minimising resistance in the subsequent filter components.

To meet the requirements of a Class 1 CT converter, the corresponding burden impedance is a resistance $R_B$ of between 5Ω (5 ohms) (100%) and 1.25Ω (25%). Also, as mentioned above, with minimised resistance the filter components will be significantly under-damped and are likely to have oscillatory dynamics. The variation of the burden resistance causes a variation in the filter dynamics which conventionally presents difficulty in providing a single stable control loop for the system. In order to create a useful and convenient product for the end user, it is desirable to avoid the necessity of adjusting the V to I converter for different values of burden resistance.

It has been recognised herein that a V to I controller 12 which is used in conjunction with a Rogowski transducer to replace a conventional class 1 CT can be tuned so that it functions as a controller which provides stability over the required range of burden resistances as well as providing an acceptable bandwidth such that the phase error at power frequencies is less than 1 degree. In order to achieve this, values for the filter components and/or the P+I controller components are selected in order to achieve a good accuracy and bandwidth across the required operating range. In this example, where there is a substantially non-inductive burden resistance with a 4:1 burden resistor range, the accuracy and bandwidth of the controller 12 can be achieved despite having a significantly oscillatory filter.

As mentioned above, the controller 12 does not always need to have a filter. However in this example, wherein the burden is taken to be predominantly resistive, the filter is necessary to minimise the 300 kHz ripple current caused by the 15V rms carrier voltage on the output of the class D amplifier. A third order filter—for example of the type shown in FIG. 5A—is required.

If only a first order filter was used—i.e. the inductor $L_F$ and capacitor $C_F$ were not included and only $L_A$ was used to reduce the ripple current to say 2.5 mA rms—an inductor value $L_A=3.2$ mH would be required (equivalent to 6.0 kΩ at 300 kHz) rated at 1.2 A rms. This would be very large and expensive particularly since a typical iron core would be ineffective at 300 kHz.

Looking in detail at the filter behaviour in conjunction with the behaviour of the feedback control loop shown in FIG. 1, the ability of the V to I converter described herein to provide stable performance at high bandwidth with variation of burden resistance can be demonstrated:

The transfer function relating I to $V_A$ is given by $$\frac{I}{V_A} = \frac{(c/R)}{s^3 + as^2 + bs + (1 + (R_F/R)) \cdot c} \quad \text{Eqn 2}$$

Where $a = \frac{R}{L_P} + \frac{R_F}{L_F}$, $b = \frac{1}{L_P C_F} + \frac{1}{L_F C_F} + \frac{R \cdot R_F}{L_P L_F}$ and $c = \frac{R}{L_P L_F C_F}$ For $R_F \ll R$ $$\frac{I}{V_A} = \frac{(c/R)}{s^3 + as^2 + bs + c} \quad \text{Eqn 3}$$

Where $a = \frac{R}{L_P}$, $b = \frac{1}{L_P C_F} + \frac{1}{L_F C_F}$ $c = \frac{R}{L_P L_F C_F}$ For sinusoidal variations such as ac voltages and currents, s may be replaced by $j\omega$.

At high frequencies, $s^3 = (j\omega)^3$ predominates such that it can be approximated that:

$$\left|\frac{I}{V_A}\right| = \frac{1}{\omega^3 L_P L_F C_F} \quad \text{Eqn 4}$$

Alternatively at low frequencies such as 50 Hz, from Eqn 2 with s→0, as would be expected, $$\left|\frac{I}{V_A}\right| = \frac{1}{(R + R_F)} \approx \frac{1}{R}$$

Eqn 4 is useful in defining the efficacy of the filter in the V to I converter. For a switching frequency of 300 kHz for the class D amplifier, putting ω=0.671 rad/µs $$\left|\frac{I}{V_A}\right| = \frac{1}{(0.6\pi)^3 L_P L_F C_F}$$

where $L_P$ and $L_F$ are in µH and $C_F$ is in µF.

To reduce the 300 kHz ripple current caused by the 15V rms ripple voltage on $V_A$ to 2.0 mA, the $L_P L_F C_F$ product needs to be at least 1100. A ripple voltage of 2 mA is sufficiently small compared with the rated current of 1 A rms at 50 Hz. Furthermore this ripple current value is not affected by the variation of R.

Typical values for the filter components and P+I controller constants are now specified to demonstrate the performance. The exact values are not essential and may be reasonably adjusted to give a largely similar performance provided the principles for operation of the V to I converter as described herein are followed.

The P+I controller constants are chosen in this example to be $K_C=0.467$ and $A_C=150$ ms$^{-1}$ and the filter values $L_F=50$ µH, $L_P=10$ µH and $C_F=2.2$ µF. The product $L_P L_F C_F=1100$.

The performance is now examined for the range of burden resistance values.

(a) $R_B=5Ω$ giving R=5.25Ω

Figure 6:
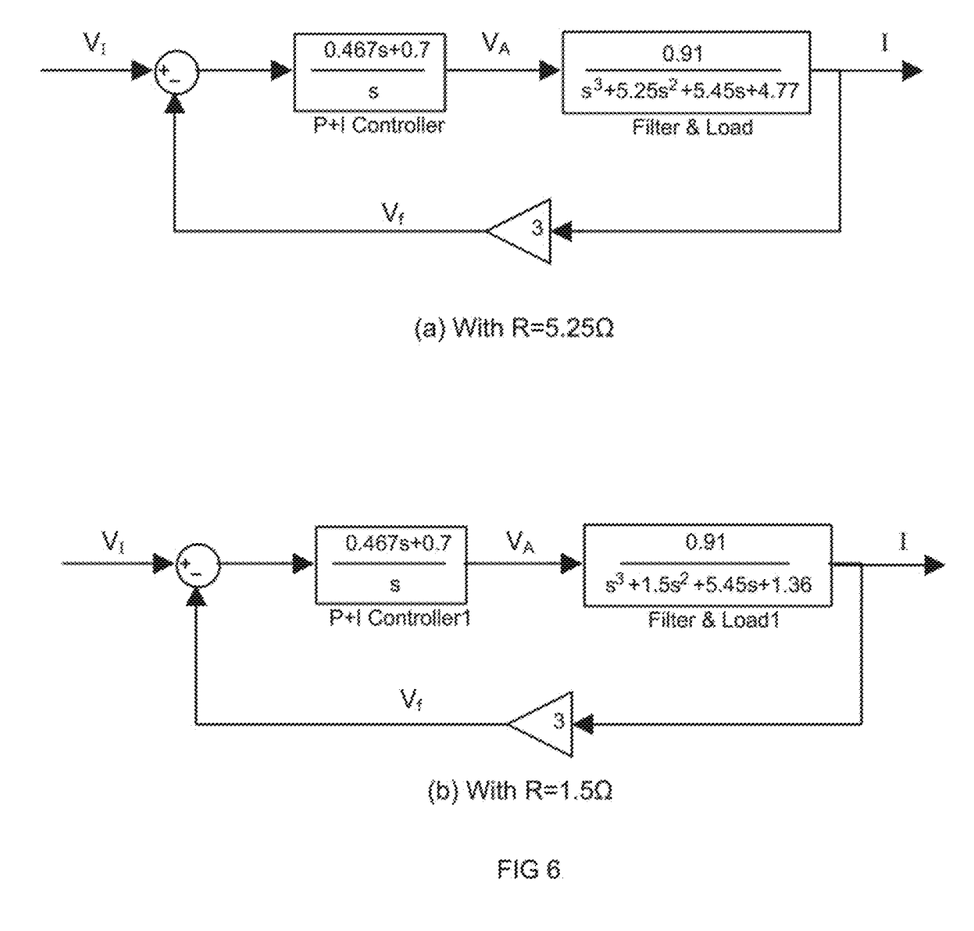
FIG. 6, comprising of FIGS. 6(a) and 6(b), shows block diagrams with Laplace transfer functions defining the typical closed loop dynamics for controlling the output current for the specified variation of burden resistance and for negligible burden inductance.

FIG. 6 shows the block diagram for the feedback control loop of the V to I convertor for $R_B=5Ω$ showing the transfer functions for each block, where s is in units of (10 µs)$^{-1}$.

Figure 7:
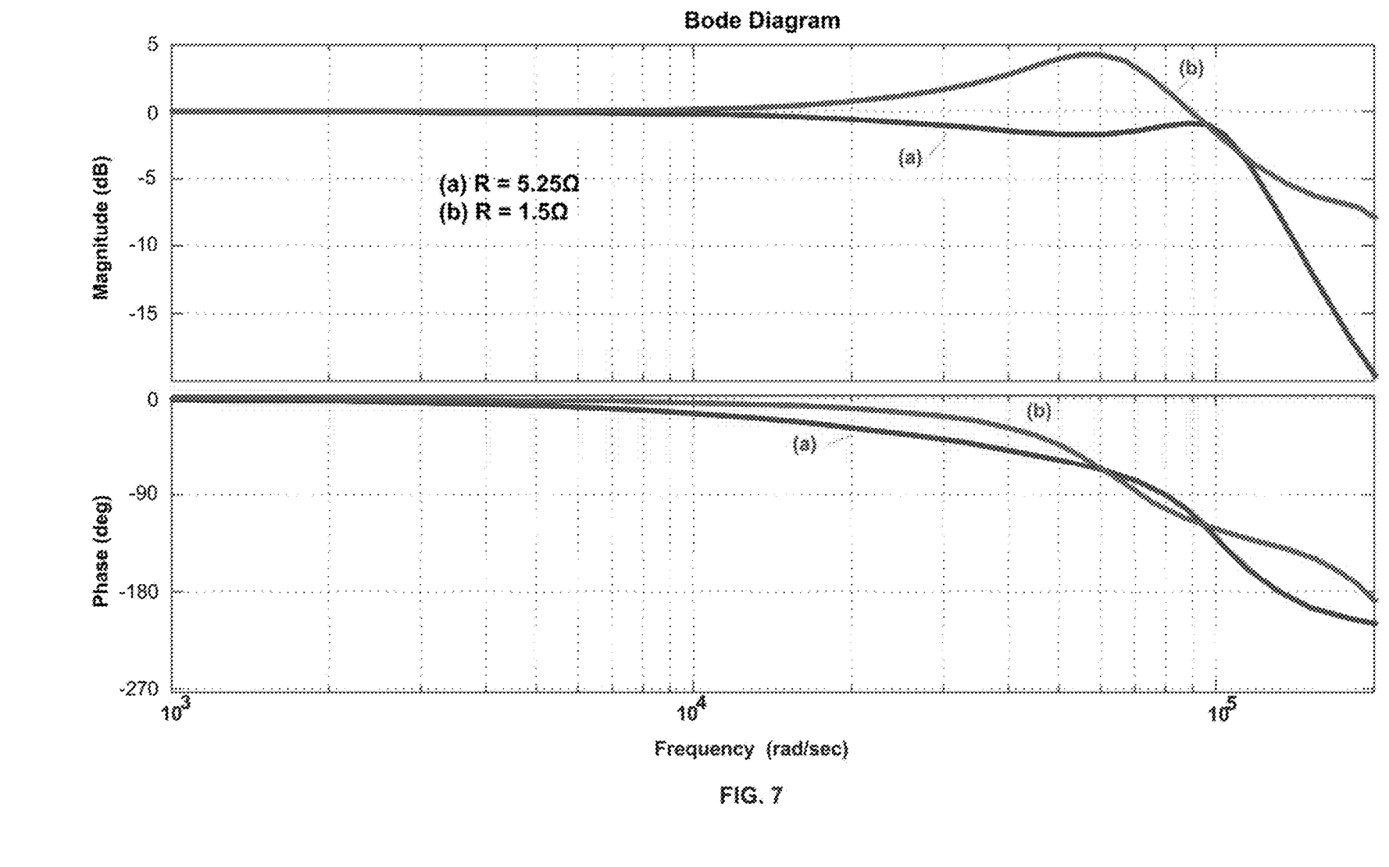
FIG. 7 shows the typical variation of gain and phase shift for the V to I converter of FIG. 1 for variation of burden resistance and for negligible burden inductance.

FIG. 7 shows the frequency response for the overall V to I converter for $R_B=5Ω$. The sensitivity has been normalised to give unity at low frequencies. The −3 dB bandwidth is 17.5 kHz and the magnitude error at 1 kHz is 0.8%. At 50 Hz the phase error is −0.45 degree and the magnitude error is negligible (b) $R_B=1.25Ω$ giving R=1.5 Ω

FIG. 6 also indicates the block diagram for the feedback control loop of the V to I convertor for $R_B=1.25Ω$ showing the transfer functions for each block where as previously s is in units of (10 µs)$^{-1}$. The complex poles for the filter and burden resistance are significantly under-damped (oscillatory) in this case.

FIG. 7 also shows the frequency response for the overall V to I converter for $R_B=1.25Ω$. There is a 4.25 dB resonance at 9 kHz. The −3 dB bandwidth is 17.5 kHz and the magnitude error at 1 kHz is 0.8%. At 50 Hz the phase error is −0.13 degree and the magnitude error is negligible.

The Rogowski transducer used in the current measurement system shown in FIG. 1 can be designed to have a phase lead of 0.29 degrees at 50 Hz, as is known in the art.

The resultant replacement CT comprising the Rogowski transducer and V to I converter 12 as described herein will have a phase error of ±0.16 degrees for the range of specified burden resistor values. This is a significant improvement on the normal CT class 1 performance. Furthermore the bandwidth is significantly higher than for iron cored class 1 CT's and enables harmonics of the current waveform to be accurately measured.

Hence it has been shown that the V to I converter disclosed herein can be used in conjunction with a Rogowski transducer to replace a conventional CT for current measurement and produce highly accurate readings. The components of the converter can be tuned and/or selected to provide high accuracy and wide bandwidth despite significant variation in the load impedance (i.e. burden impedance as shown in FIG. 1). The converter can also maintain this high accuracy and stability even when using a highly oscillatory filter. Furthermore, phase error can be minimised using the converter in combination with a Rogowski transducer.

As mentioned above, this example assumes that burden is resistive, and thus non inductive. However it has been shown that the performance of the system can remain acceptable even when the burden inductance $L_B$ is non negligible. The inductance $L_B$ can be increased to 20 μH (i.e. $L_P \leq 30$ μH) for the range $1.25\Omega < R_B < 5.0\Omega$ without the performance of the V to I converter 12 being adversely affected. This represents virtually all burdens where the burden is a resistor and where the connections between the CT replacement and the burden resistor are short.

If $L_B$ is further increased then resonances occur and eventually the system becomes unstable. Therefore in practice it is preferable to amend the design of the V to I converter 12 for burdens with inductances greater than 20 μH, as shown in the second example set out below. This change of design can be made by the manufacturer and the acceptable load variation for the resulting system can be specified when the product is sold to the end user. This is standard practice in the field. Therefore the end user can select the type of V to I converter he or she needs to use in conjunction with a Rogowski coil for current measurement dependent on the type of load to be used therewith. The end user will not have to make any adjustments to their selected converter as long as it is used with loads within the range specified.

Second Example

As a second example the case is considered where the burden on the class D amplifier 14 and filter 15 is not predominantly resistive and has some inductance. This covers a much wider range of loads than the first example above covers.

The inductance can be relatively small (tens of μH (microHenries)) such that the power factor is still very close to unity, or can be of the order of mH such as for the coil of a protection relay. Some CT systems are specified for power factors between 1.0 and 0.8. For a burden power factor of 0.8, a 5Ω impedance at 50 Hz represents an inductance of approximately 9.5 mH. In practice it is desirable for the end user to be able to use the same V to I converter with a range of different load inductances without having to adjust the converter.

The increased inductance of the load in this example has the effect of lowering the natural frequency of the filter dynamics and potentially increasing the instability. The V to I converter disclosed herein can be tuned by inclusion of appropriate components in order to provide stability with inductive burdens although it is not possible to achieve the high bandwidth of the first embodiment. Phase error is also of less importance in these high-inductance applications.

The skilled reader will recognise that this second example covers many more real-world conditions than the first example does but the required performance can be relaxed, particularly in terms of bandwidth, since as $L_B$ increases the possibility of metering applications reduces. Nevertheless the V to I converter disclosed herein can still provide a high level of performance.

For a wide range of possible inductance values it is not possible to have a single converter design which remains acceptably stable unless the performance is greatly diminished. However it is shown herein that by reducing the filter capacitor value in two stages without changing the P+I controller values an acceptable performance can be achieved.

In particular, we can provide a single V to I converter which will meet both the wide range of variation of $L_B$ and $R_B$. For convenience the variation of $R_B$ is taken to be the same as example 1, namely $1.25\Omega < R_B < 5.0\Omega$.

Since $L_B$ is significant, and hence $L_P$, examination of eqn 4 indicates that it is beneficial to utilise $L_B$ as an aid in providing the required filtering since this inductance does not have to be provided by the V to I converter. As $L_B$ increases so the values of either or both $L_F$ and $C_F$ can be reduced. Furthermore as $L_B$ increases so the band-with of the system reduces hence it is advantages to reduce either $L_F$ or $C_F$ to reduce this effect. In practice it is best to reduce $C_F$ as $L_B$ increases.

It is desirable to avoid having a large number of controllers to meet the range of values for $L_B$ and R. It has been recognised herein that this objective can be met by splitting the variation of $L_B$ into two ranges, each range having a different value for $C_F$, and by keeping $L_F$ and $L_A$ constant throughout. Typical values for such ranges are (a) 0 μH<$L_B$<250 μH, $C_F$=2.2 μF, $L_F$=10 μH, $L_A$=50 μH
(b) 250 μH<$L_B$<3 mH, $C_F$=0.33 μF, $L_F$=10 μH, $L_A$=50 μH The case for $L_B$>3 mH is covered by the third example below.

The instability referred to in the first example is avoided by providing some resistance $R_F$ which is chosen to be typically 0.2Ω. The values for the P+I controller are also slightly modified to be $K_C$=0.25 and $A_C$=150 ms$^{-1}$ and are the same for the entire range. The only variation therefore is for the V to I converter to have means for switching the value of $C_F$.

The choice of filter component and P+I controller values given in this typical example provides stable operation throughout the range of variation of R and $L_B$ and at the same time provides good accuracy at 50 Hz and a bandwidth of at least 1 kHz. Calculation of the performance follows exactly the same process as for the first example using Eqns 1 and 2 and the block diagram format of FIG. 6 albeit with slightly different numerical values.

Hence it has been shown herein that a V to I converter such as the one shown in FIG. 1 can also be used to replace a current transformer (CT) when used in conjunction with a Rogowski transducer even when the converter is connected to a high inductance load. The type of converter for use with such a load should include a means for switching the capacitor value in the filter wherein different filter capacitor values enable the converter to work in conjunction with different respective ranges of load inductance.

Figure 5B:
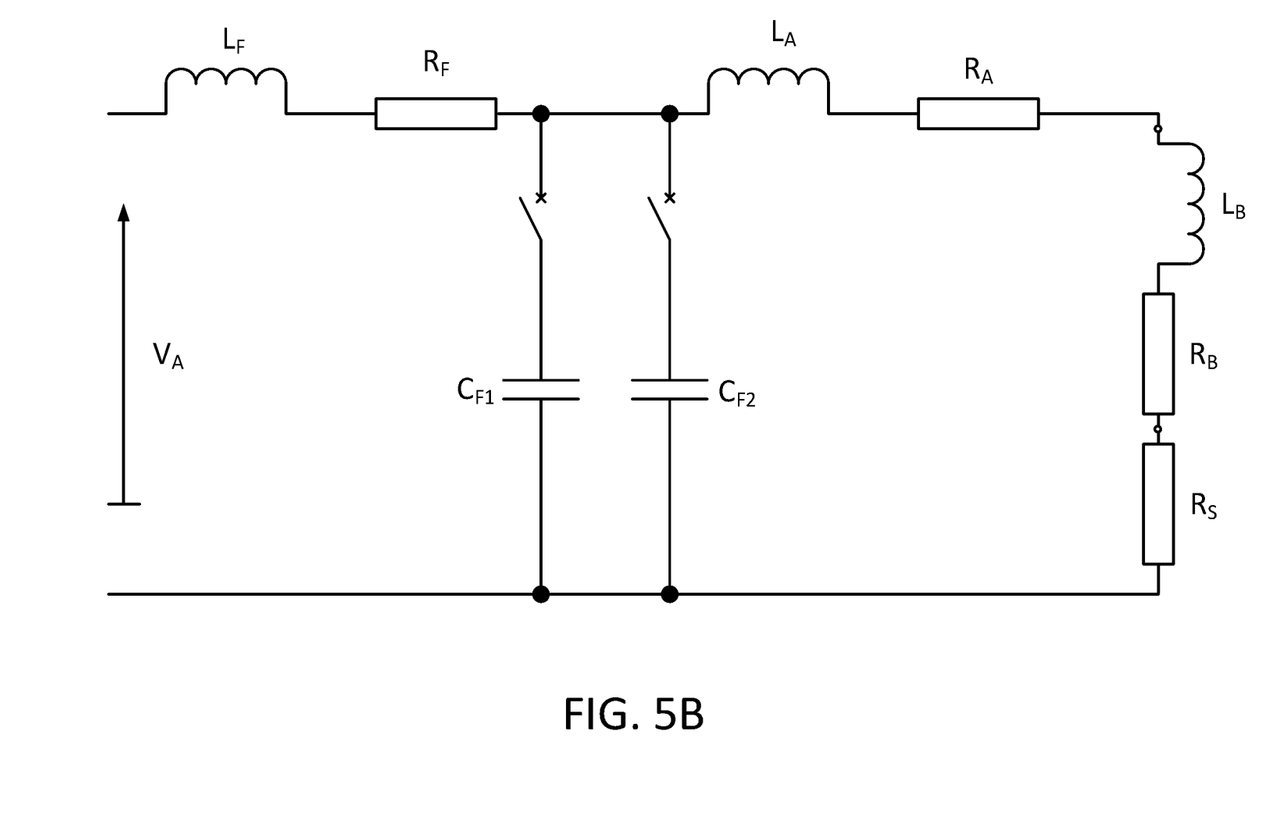
FIG. 5B shows a circuit for a filter with switchable capacitors to provide different values of filter capacitance.
Figure 5C:
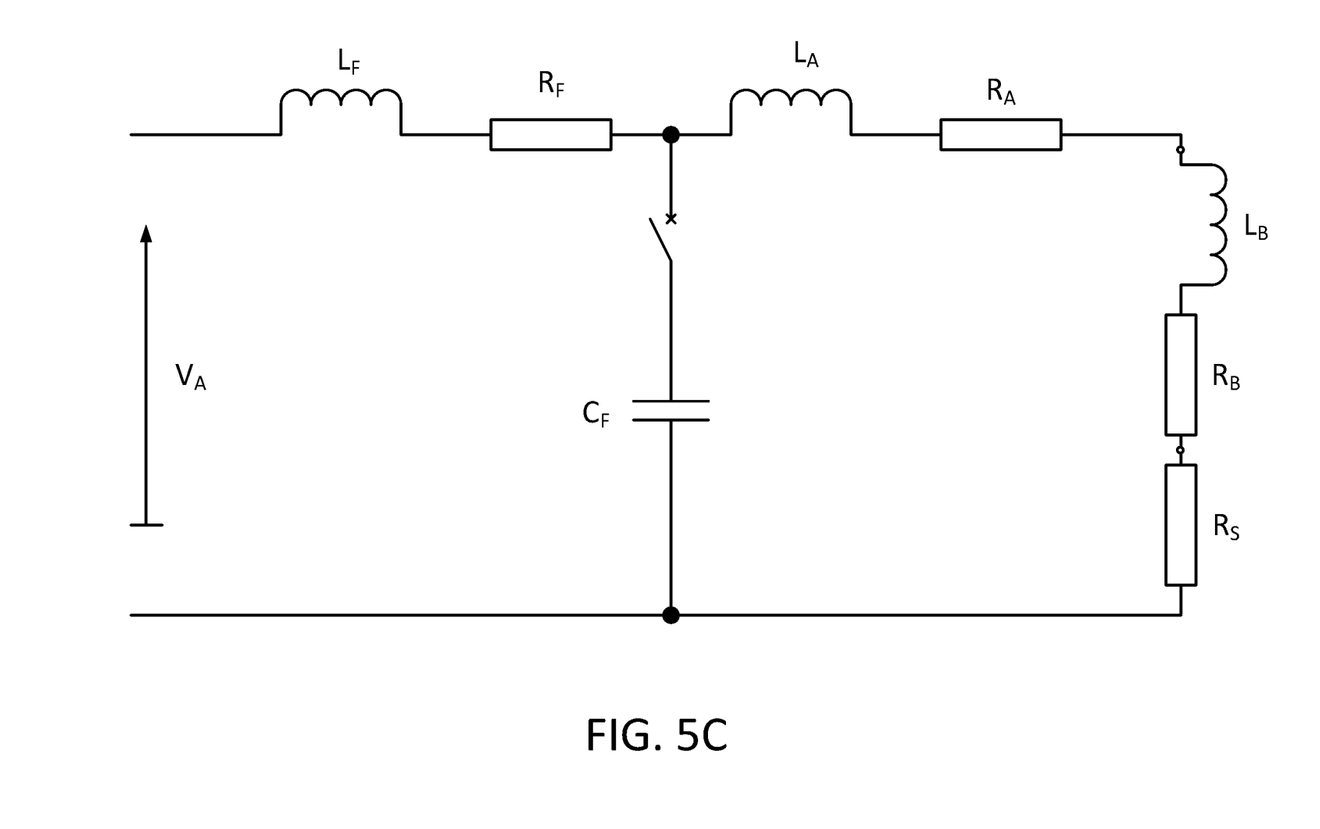
FIG. 5C shows a circuit for a filter with a capacitor that may be switched out.

The second example presented hereabove describes having two possible values of filter capacitance $C_F$ for use with two different respective ranges of load inductance (e.g., as shown in FIG. 5B). However it is possible to have more than two different values of $C_F$ in order to further vary the range of inductances that can be used in conjunction with the converter. For example, as set out in the third example below, the converter can be designed to have an option of switching the filter capacitor out (e.g., as shown in FIG. 5C) in order for the converter to be used with loads where the burden has significant inductance. However in practice it is likely to be simpler and cheaper to use a voltage to current converter with no filter components for the case $L_B \geq 3$ mH than to provide extra switches in a converter which enables different values of $C_F$ to be selected.

Therefore in practice if the end user buys a V to I converter for use with high inductance loads, the only adjustment that the end user would have to make to the converter, in order to use it in combination with a Rogowski transducer to replace a conventional CT for current measurement, is to switch the value of filter capacitance according to the range of load inductance to be connected to the converter at any given time. Therefore the product is highly convenient for the end user and does not require particular knowledge or skill on behalf of the user in order to be used correctly and safely.

In the case where the burden impedance has significant inductance $L_B$ this can be utilised to curtail the ripple current without the need for additional filter components, as set out in the third example below.

Third Example

If the burden inductance is sufficiently large there is no necessity for providing a filter capacitor and inductor since the burden inductance provides sufficient attenuation of the ripple current from the class D amplifier. In this case it is necessary to have different values for the P+I controller.

The third example is an extension of the second example, relating to applications with a relatively high burden inductance which is taken as typically $L_B \geq 3$ mH. In this case there is sufficient burden inductance to limit the ripple current to $\leq 2.67$ mA without the necessity of filter components $L_A$ $L_F$ $C_F$. Either the same system as for the second example can be used but with the capacitor $C_F$ switched out (e.g., as shown in FIG. 5C, in which case $C_F=0$ and the total inductance $L_T=L_F+L_A+L_B$) or a system can be provided with $L_A$ $L_F$ $C_F$ removed (in which case $C_F=0$ as before and the total inductance $L_T=L_B$).

Where $C_F=0$ the behaviour of the feedback loop of FIG. 1 is substantially changed since the transfer function relating I to $V_A$ is no longer defined by Eqn 2 but is now given by the first order expression $$\frac{I}{V_A} = \frac{(1/L_T)}{s + R/L_T} \qquad \text{Eqn 5}$$

As for the previous example, it is desirable to have a single controller which will provide acceptable performance for the typical range $1.25\Omega < R_B < 5.0\Omega$ and for a wide variation of $L_B$. For high inductance loads, this can be achieved by changing the P+I controller constants to typically $K_C=26.7$ and $A_C=2.5$ ms$^{-1}$.

For the range 3 mH$<L_B<$12 mH the accuracy of the V to I converter at 50 Hz is 0.6% or better and the phase lag 0.51 deg or better with a bandwidth of 1.4 kHz or better. Increasing $L_B$ to 30 mH also provides a very good performance with an accuracy of 1.4%, a phase lag of 0.58 deg and a bandwidth of 700 Hz. Higher values of burden inductance are very unlikely.

Thus it has been shown that a V to I converter such as the one shown in FIG. 1 can be used to replace a CT when used in conjunction with a Rogowski coil even when the converter is connected to loads having high burden inductance. This is done by altering the capacitance value for the filter in the converter, or perhaps omitting the filter entirely for very high inductance values, and tuning the constants for the P+I controller. The filter can be modified to be a switching filter, or can be omitted altogether, and the controller can be tuned, both by the manufacturer. The resulting converter would be sold with an indication of the loads with which it can be used. The end user would simply have to select the appropriate converter for the loads with which it wishes to use the converter and Rogowski transducer for current measurement and could then proceed to use the equipment without having to make any adjustments thereto. Therefore the converter is highly convenient for the user and does not require particular skill on behalf of the end user in order to be used as a successful CT replacement product.

Advantages and Variants

The V to I converter and current measurement system disclosed herein provide highly accurate current measurements with little or no phase error and thus in terms of measurement values they provide a significant advantage over conventional CT arrangements. The system provides a true analogue of the current which is being measured. Furthermore, the converter and system can be provided in a manner that is more compact and less heavy than conventional CT's. They also do not provide the short circuiting dangers associated with CT's.

The V to I converter and current measurement system disclosed herein go against conventional thinking in the art by performing a double conversion during current measurement. It has been recognised herein that, by selecting and tuning appropriate components of the V to I converter, the current measurement system disclosed herein provides significant advantages over prior art arrangements despite performing a double conversion from current to voltage and back to current. In particular, the system can provide good performance over a wide range of load impedance values without the need to adjust the controller values or filter components, if the components of the converter are suitably selected and tuned from the outset.

By using a load, or part of a load, on a V to I converter as a filter as described in relation to an example above, electrical components are employed in an intelligent and cost-efficient manner. This adds to the overall compactness and cost-effectiveness of the system.

In practice the V to I converter can be provided with labelling to clearly indicate its range of operation. This labelling may include a serial number, the rated primary current, rated output, rated burden and class (using, for example, CT classification) and supply voltage. As long as the converter is used within the specified ranges, it will not need to be adjusted by the end user when being used in conjunction with a Rogowski transducer for current measurement, in order to output a true analogue of that measured current. Therefore the converter is very useful in practice and does not require any particular skill or knowledge on behalf of the end user in order to be used safely and effectively.

The three examples above have covered applications from zero burden inductance to 30 mH and burden resistance values of 100% to 25% of rated value. However the same principles can be applied to other burden inductances and burden resistance value ranges.

The values of the P+I controller constants in the first example above have been chosen to provide good closed loop performance of the controller. However the system described herein is not limited to those particular values. In combination with the choice of filter component values, choice of appropriate P+I controller constants can provide satisfactory performance of the system described herein, bearing in mind the oscillatory behaviour of the filter and load. The range of acceptable values for the filter components and P+I controller constants will vary dependent on what level of performance can be deemed to be satisfactory in any given practical situation. For example, when choosing controller values one can consider various factors including how peak resonance values, bandwidth, damping ratios, or any other suitable performance characteristic(s) of the system change with variation of the constants $K_C$ and $A_C$.

The first two examples above have been specifically related to a 5 VA 1 Arms CT replacement. However the principles disclosed herein are nevertheless applicable to other VA ratings and output currents.

In the case of a 5 VA 5 Arms CT replacement the burden impedances are all reduced by a factor of 5. If the inductance values $L_F L_A$ for the filter and the current sense resistor $R_S$ are all similarly reduced by a factor of 5 and if the filter capacitance $C_F$ is increased by a factor of 5 and the values for the P+I controller are kept the same as for the 5 VA 1 A rms system then the dynamic performance for all the various burden conditions remains exactly the same. The power required for the class D amplifier will however increase by a factor of approx 5.

In the case of a 15 VA 1 Arms CT replacement the burden impedances are all increased by a factor of 3. If the inductance values $L_F L_A$ for the filter and the current sense resistor $R_S$ are all similarly increased by a factor of 3 and if the filter capacitance $C_F$ is reduced by a factor of 3 and the values for the P+I controller are kept the same then the dynamic performance for all the various burden conditions again remains exactly the same. The power required for the class D amplifier will however increase by a factor of approx 3.

Whilst particular embodiments and examples have been described and shown in the appended figures, variations can be made without departing from the scope of the invention as set out in the claims.

The invention claimed is:

1. A voltage to current converter for use with a current measuring device, said current measuring device being operable to provide an output voltage ($V_I$) which is an analogue of a current ($I_1$) to be measured, said converter being arranged to provide an output current (I) which is an instantaneous analogue of said current ($I_1$) to be measured, wherein said converter comprises:
    means for measuring the output current (I) to generate a feedback voltage ($V_F$) that is an analogue of the output current (I);
    an electronic controller to:
        receive the output voltage ($V_I$) from the current measuring device and the feedback voltage ($V_F$) from the means for measuring the output current (I);
        compare are the output voltage ($V_I$) with the feedback voltage ($V_F$); and
        generate a control voltage ($V_C$) based on the comparison;
    a switching amplifier coupled to the electronic controller to receive the control voltage ($V_C$) and generate an amplified voltage ($V_A$) based on the control voltage ($V_C$); and
    a filter coupled to the switching amplifier to filter the amplified voltage ($V_A$) to provide the output current (I).

2. The converter of claim 1 wherein said electronic controller comprises a proportional-integral (P+I) controller.

3. The converter of claim 1 wherein said switching amplifier comprises a class D amplifier.

4. The converter of claim 1 wherein said means for measuring the output current (I) to generate a feedback voltage ($V_F$) that is an analogue of the output current (I) comprises a resistor.

5. The converter of claim 1 further comprising a load connected to the converter.

6. The converter of claim 5 wherein the load has an inherent burden impedance ($L_B$), wherein said inherent burden impedance ($L_B$) of the load is arranged to operate as a filter.

7. The converter of claim 1 wherein the filter comprises a third order filter.

8. The converter of claim 1 wherein the filter comprises an inductor in series with an output of the switching amplifier and a capacitor across the output of the switching amplifier and of the first inductor.

9. The converter of claim 8 wherein the filter further comprises a second inductor connected between the capacitor and an output of the converter.

10. The converter of claim 1 wherein the filter has an inherent capacitance $C_F$, said capacitance $C_F$ being switchable between a first value and a second, different value.

11. The converter of claim 10 wherein the inherent capacitance $C_F$ of the filter is switchable so that, in one mode of operation of the converter, $C_F$ is substantially zero.

12. The converter of claim 1 wherein the electronic controller comprises an operational amplifier and a plurality of passive components ($R_0$, $R_1$, $R_2$ and $C_1$) wherein the electronic controller provides the control voltage ($V_C$) at a given frequency ($\omega$), said control voltage ($V_C$) being defined as:

$$V_C = \frac{K_C(s + A_C)}{s}\{V_I - \beta \cdot V_F\}$$

where $$s = j\omega, K_C = \frac{R_2}{R_0}, \beta = \frac{R_0}{R_1} \text{ and } A_C = \frac{1}{C_1 R_2}.$$

13. A current measurement system comprising:
    a voltage to current converter for use with a current measuring device, said current measuring device being operable to provide an output voltage ($V_I$) which is an analogue of a current ($I_1$) to be measured, said converter being arranged to provide an output current (I) which is an instantaneous analogue of said current ($I_1$) to be measured, wherein said converter comprises:
        means for measuring the output current (I) to generate a feedback voltage ($V_F$) that is an analogue of the output current (I),
    an electronic controller to:
        receive the output voltage ($V_I$) from the current measuring device and the feedback voltage ($V_F$) from the means for measuring the output current (I);
        compare are the output voltage ($V_I$) with the feedback voltage ($V_F$); and
        generate a control voltage ($V_C$) based on the comparison, a switching amplifier coupled to the electronic controller to receive the control voltage ($V_C$) and generate an amplified voltage ($V_A$) based on the control voltage ($V_C$), and a filter coupled to the switching amplifier to filter the amplified voltage ($V_A$) to provide the output current (I);

and said current measuring device connected thereto, said current measuring device being operable to provide the output voltage ($V_I$) which is an analogue of the current ($I_1$) to be measured by the system.

14. The system of claim 13 wherein the current measuring device comprises a Rogowski transducer.

15. A method of manufacturing a voltage to current converter for use with a current measuring device, said current measuring device being operable to provide an output voltage ($V_I$) which is an analogue of a current ($I_1$) to be measured, said converter being arranged to provide an output current (I) which is an instantaneous analogue of said current ($I_1$) to be measured, wherein said method comprises:

providing means for measuring the output current (I) to generate a feedback voltage ($V_F$) that is an analogue of the output current (I);

providing an electronic controller to:

receive the output voltage ($V_I$) from the current measuring device and the feedback voltage ($V_F$) from the means for measuring the output current (I);

compare the output voltage ($V_I$) with the feedback voltage ($V_F$); and generate a control voltage ($V_C$) based on the comparison;

providing a switching amplifier coupled to the electronic controller to receive the control voltage ($V_C$) and generate an amplified voltage ($V_A$) based on the control voltage ($V_C$); and providing a filter coupled to the switching amplifier to filter the amplified voltage ($V_A$) to provide the output current (I).

16. The method of claim 15 comprising including a selected component in the converter, the component being selected based on an operational characteristic of said component, said selection being made so that the converter can, in operation, provide a measure of the output current (I), which is an analogue of said current ($I_1$) to be measured that is accurate to within a predetermined limit under a predetermined variety of operating conditions.

17. The method of claim 16 wherein the component to be selected is any of: a switching amplifier, an electronic controller, a resistor, a capacitor, an inductor, a connector, or a filter.

18. The method of claim 17 wherein the predetermined variety of operating conditions includes any of: a range of burden resistance, a length of a connector, a phase error, a signal oscillation, or a range of burden inductance.

19. The method of claim 16 wherein the predetermined limit is determined by an accuracy classification applied to current transformers (CT's).

* * * * *